Feb. 21, 1961 S. P. D'AMICO 2,972,710

INDUCTIVE LOAD TRANSISTOR BRIDGE SWITCHING CIRCUIT

Filed April 3, 1959 2 Sheets-Sheet 1

INVENTOR
SALVATORE P. D'AMICO
BY Borst & Borst
ATTORNEYS

Feb. 21, 1961 S. P. D'AMICO 2,972,710

INDUCTIVE LOAD TRANSISTOR BRIDGE SWITCHING CIRCUIT

Filed April 3, 1959 2 Sheets-Sheet 2

2,972,710

INDUCTIVE LOAD TRANSISTOR BRIDGE SWITCHING CIRCUIT

Salvatore P. D'Amico, Merrick, N.Y., assignor to Sperry Rand Corporation, Ford Instrument Company Division, Wilmington, Del., a corporation of Delaware Filed Apr. 3, 1959, Ser. No. 803,964

2 Claims. (Cl. 317—148.5)

This invention relates to bridge amplifiers which are adapted to reversibly drive direct current and high power alternating current loads.

The unique bridge amplifier as contemplated by this invention is arranged to employ electromagnetic switching components, such as magnetic amplifiers or transistors, in the conventional bridge configuration. Each of the four switching components is disposed in its own circuit and the components are switched or triggered to operate their individual circuits by a phase reversible signal. Where transistors are employed as the switching components, the amplifier is operable to obtain maximum power output from the bridge.

The four base circuits of the amplifier employing transistor switching may be specially arranged so that the amplifier will drive an inductive load. Whether the switching components are magnetic amplifiers or transistors the control signal is applied to the four component circuits in the bridge in such a way that one pair of components is driven into saturation and, hence switched on, while the other pair of components is simultaneously driven to cut-off and hence, switched off. The amount of power delivered to the load is controlled by the duration of the control signal pulses and the selection of corresponding components composing the component pairs is dependent on whether A.C. or D.C. load output is desired.

One object of the invention is to provide a bridge amplifier employing electromagnetic switching components in the four bridge legs.

Another object of the invention is to provide a bridge amplifier having a switching circuit in each leg and arranged to drive an inductive load.

Figure 1:
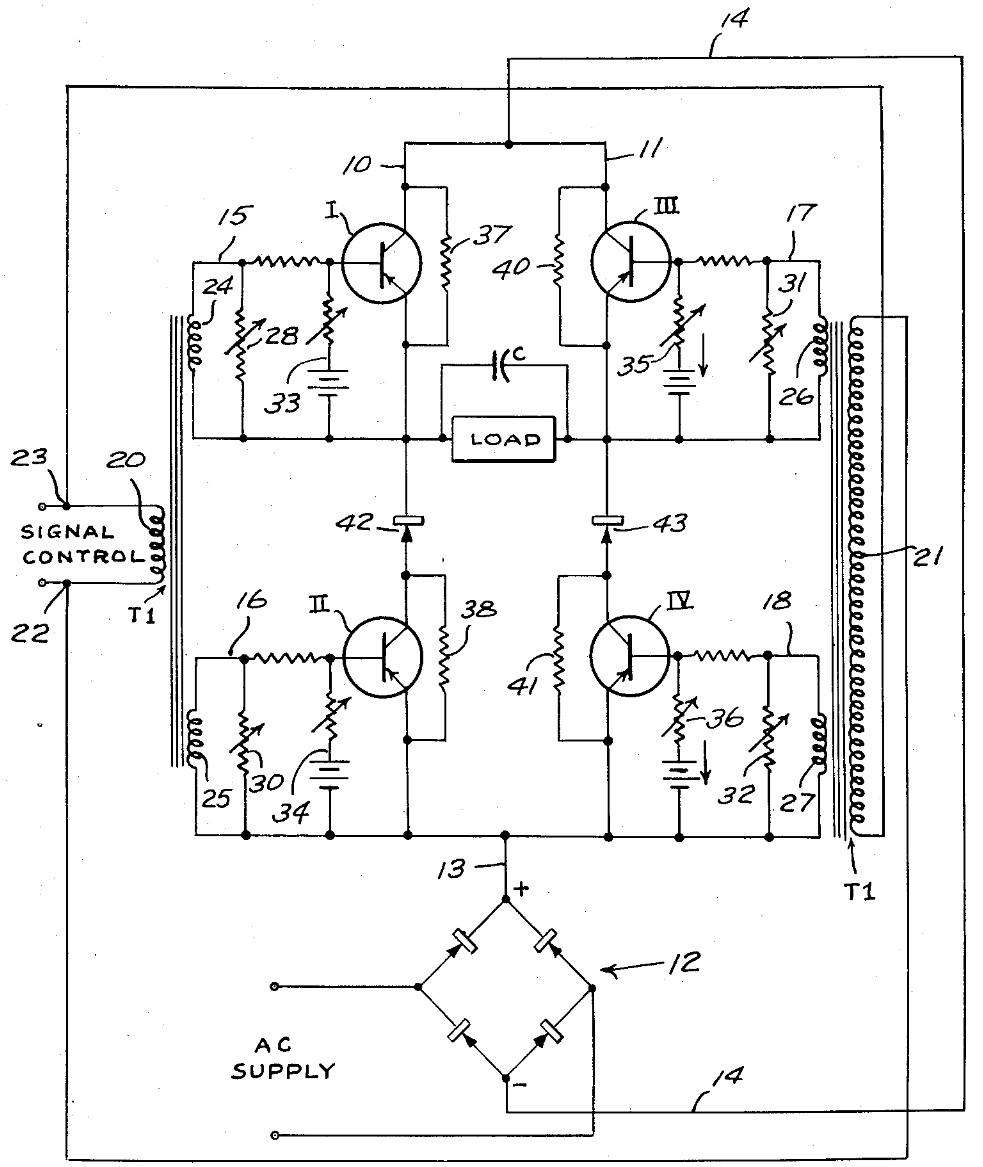
Figure 2:
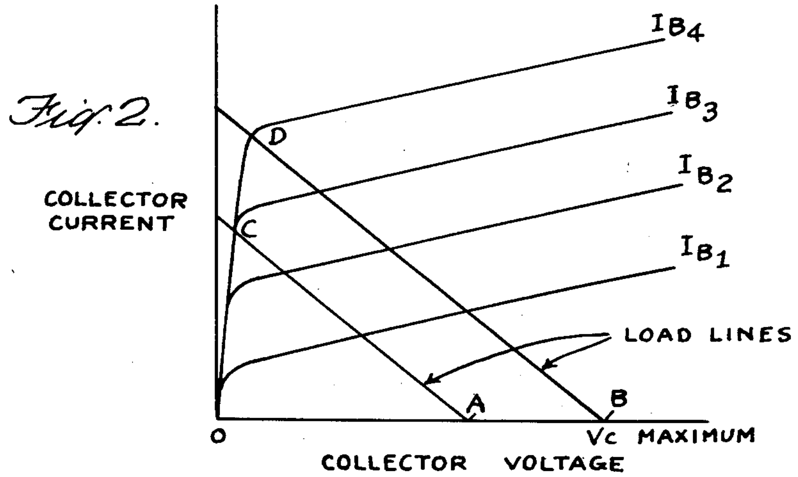
Figures 3, 3A, 3B, 3C:
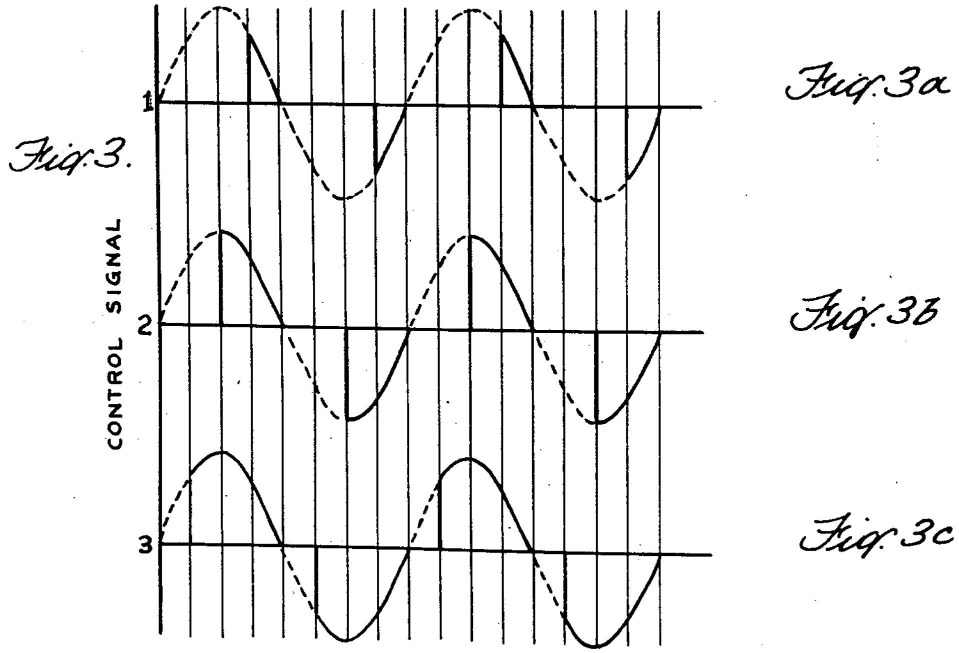
Figure 4:
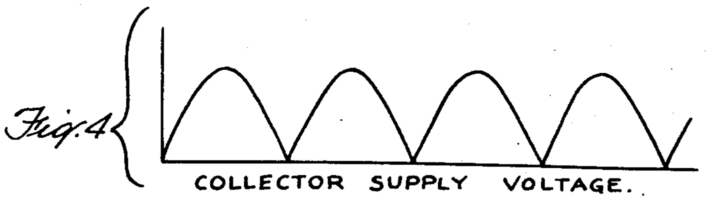

Other objects and advantages of the invention may be appreciated on reading the following detailed description of one embodiment of the invention, the description to be taken in accordance with the accompanying drawings, in which Fig. 1 is a schematic showing the novel bridge amplifier, Fig. 2 is a graph showing the relation of collector current and voltage with and without a signal applied to the amplifier, Figs. 3*a*, 3*b* and 3*c* show the various duration wave forms of the control signal applicable to the amplifier for load power determination, and Fig. 4 shows the full wave rectified voltage form to be supplied the amplifier.

Referring to the drawings, the bridge amplifier includes a pair of parallel branch circuits 10 and 11 which are placed across full wave rectified voltage source 12 by means of lines 13 and 14. The branch circuit 10 includes a pair of series transistors I and II while the branch circuit 11 has a pair of series transistors III and IV. The collector circuit for each transistor is applied by the voltage source 12 through the bridge network.

The transistors I, II, III and IV have base circuits 15, 16, 17 and 18, respectively. A control signal supply is impressed across a transformer T1 having a primary winding 20, a second primary winding 21, the polarity of which is opposite to the polarity of the primary winding 20 by virtue of the polarity reversing connections 22 and 23. Each of the base circuits, which are the switching circuits for the transistors, having a secondary winding coupled to the transformer T1. Accordingly, secondaries 24, 25, 26 and 27 are disposed in the switching circuits 15, 16, 17 and 18, respectively. The load is connected across the parallel branch circuits at points therein between the series transistors. Thus, the four transistors are connected in a bridge configuration. The transistors are switched on when base current places them in saturated condition and base current will flow when their base electrodes are negative with respect to their emitter electrodes. The full wave rectified voltage supplied, shown in Fig. 4, is applied to the bridge and the transistors I and IV are switched on simultaneously during one half cycle when the secondaries 24 and 27 are negative and the transistors II and III are switched on simultaneously during the succeeding half cycle when the secondaries 25 and 26 are negative. When transistors I and IV are switched on, current flows through the load from right to left since most of the voltage drop in the lines 10 and 11 takes place across the transistors II and III and when transistors II and III are switched on current flows in the opposite direction since the transistors I and IV are the high voltage components. It is assumed that the signal is phase reversible and that the duration of the signal pulses can be controlled at the signal supply in accordance with the amount of power it is desired to deliver to the load. The transistors are switched on by applying a negative signal to their base electrodes, thus driving the elements into saturation and reducing the voltage dropping impedances in the branch circuits supplied by the source 12. As one pair of transistors is thus switched on the other pair is switched off when positive signal pulses are applied to their respective switching circuits so as to drive the transistors into their cut-off regions.

In order to obtain the maximum power output from the bridge when a particular transistor type is used, it is necessary to keep the dissipation in the transistors to a minimum. This is achieved by operating the transistors in a saturated region, along curve OD in Fig. 2, when delivering current to the load. With no signal applied to the transistors the collector voltage and current will lie along line OB during the cycle (assuming negligible $I_{co}$). When a signal is applied such as is shown in Fig. 3*a*, the transistor will be switched along line AC to the saturated region. When the transistor is operating between points A and C the instantaneous dissipation will be high, but if the rise time of signal and load current is small, the average dissipation during the switching time will be low. The base drive is in phase with the collector supply voltage and is adjusted so that the transistor is always driven into saturation when a signal is applied. Once the transistor has been switched the operating point follows curve CO until the end of the half cycle. If a signal such as that shown in Fig. 3*b* is applied the transistor will be switched at the 90° point and the operating point will follow curve BDCO. If the signal shown in Fig. 3*c* is applied the transistor will be switched along line AC to the saturated region, after which it follows curve CDCO. In each case the dissipation is kept to a minimum.

The bridge amplifier can be especially adapted to drive an inductive load. To this end, variable resistors 28, 30, 31 and 32 are disposed across the secondaries of the base circuits 15, 16, 17 and 18, respectively, to reduce the nonlinearity of the total load on the transformer T1. This is necessary in order that the transformer will operate over a region of relatively constant permeability so that the base drive signal will not be distorted. In order to achieve a maximum power output, the transistors in the bridge are operated close to their maximum voltage rating. Resistors are biased with positive base current to reduce $I_{co}$ and prevent runaway. Bias supply voltage sources and resistor series combinations 33, 34, 35 and 36 are disposed across the secondary windings 24, 25, 26 and 27, respectively, in each of the component switching circuits in order to accomplish this base electrode biasing. Additionally, resistors 37, 38, 40 and 41 are shunted across the resistors I, II, III and IV in order to balance the voltages across the transistors when the bridge is not conducting. Half wave rectifiers 42 and 43 are provided in the branch circuits 10 and 11, respectively, and a capacitor C is connected across the load in order to reduce the voltage induced in the load as the load current is dropped to zero each time the base current in the switching circuits cross zero at the end of each half cycle resulting in a high value impedance forcing the load current to drop to zero.

Various modifications may be made in the bridge circuit design without necessarily departing from the principal and scope of the invention as defined in the appended claims.

What is claimed is:

1. A bridge amplifier comprising a full wave rectified voltage supply, a pair of parallel branch circuits disposed across said supply, a signal supply, each branch circuit having a pair of switching circuits with each switching circuit having a transistor, the base and emitter electrodes of which are coupled to said signal supply, its collector electrode being disposed in one of said branch circuits, an inductive load disposed across said parallel branches, each of said switching circuits further including a series connected voltage source and resistor network, said network being disposed across said base and emitter electrodes, there being provided a shunt resistor across the emitter and collector electrodes of each transistor in the branch circuits, a half wave rectifier disposed in each branch circuit and a capacitor connected across the load whereby said bridge amplifier is arranged to drive an inductive load.

2. A bridge amplifier as defined in claim 1 wherein a variable resistor is disposed across the voltage source and resistor network in each of said switching circuits.

References Cited in the file of this patent

UNITED STATES PATENTS

| | | |
|---|---|---|
| 2,723,373 | Steinitz | Nov. 8, 1955 |
| 2,821,639 | Bright et al. | Jan. 28, 1958 |
| 2,897,296 | Buchold | July 28, 1959 |